(12) United States Patent
Shibata et al.

(10) Patent No.: US 7,530,748 B2
(45) Date of Patent: May 12, 2009

(54) CAMERA MODULE

(75) Inventors: Hisashi Shibata, Yamagata (JP); Toshihiko Sato, Yamagata (JP)

(73) Assignee: Mitsumi Electric Co., Ltd., Yamagata (JP)

( * ) Notice: Subject to any disclaimer, the term of this patent is extended or adjusted under 35 U.S.C. 154(b) by 431 days.

(21) Appl. No.: 11/495,474

(22) Filed: Jul. 28, 2006

(65) Prior Publication Data
US 2007/0053685 A1 Mar. 8, 2007

(30) Foreign Application Priority Data
Sep. 6, 2005 (JP) ............................. 2005-258498

(51) Int. Cl.
*G03B 17/00* (2006.01)
(52) U.S. Cl. ...................... 396/529; 359/808; 359/809; 359/819; 359/827; 359/829
(58) Field of Classification Search ................. 396/275, 396/529; 359/808, 809, 818, 819, 827, 829
See application file for complete search history.

(56) References Cited
U.S. PATENT DOCUMENTS
4,110,008 A * 8/1978 Uesugi et al. ............... 359/825

| 2004/0094825 | A1* | 5/2004 | Onishi et al. | 257/666 |
| 2005/0220453 | A1* | 10/2005 | Mano | 396/529 |
| 2006/0251414 | A1* | 11/2006 | Nishizawa | 396/275 |
| 2007/0183773 | A1* | 8/2007 | Aoki et al. | 396/529 |

FOREIGN PATENT DOCUMENTS
JP  A-09-294190  11/1997
JP  A-2005-017312  1/2005

* cited by examiner

*Primary Examiner*—Rochelle-Ann J Blackman
*Assistant Examiner*—Warren K Fenwick
(74) *Attorney, Agent, or Firm*—Patents + TMS, P.C.

(57) ABSTRACT

A camera module is composed from a lens unit including at least one lens, a barrel provided with the lens and having a barrel opening, and a lens holder for holding the barrel; and an image pickup device portion provided under the lens unit and having an image pickup device housing space in which an image pickup device is hermetically provided. The barrel opening of the barrel has an annular edge which serves as a diaphragm, and the annular edge of the barrel opening has a lower annular corner portion which is located on the side of the lens, wherein the lower annular corner portion of the annular edge is formed so as to have a rounded cross-sectional shape and staining is formed on the lower annular corner portion.

4 Claims, 2 Drawing Sheets

CAMERA MODULE

This application claims priority to Japanese Patent Application No. 2005-258498 filed Sep. 6, 2005, which is hereby expressly incorporated by reference herein in its entirety.

BACKGROUND OF THE INVENTION

1. Field of the Invention

The present invention relates to a camera module, and more specifically to a camera module having a relatively compact size to be equipped in camera-equipped electronic apparatuses, such as, for example, a cellular phones and the like.

2. Description of the Prior Art

In a camera module having a relatively compact size to be equipped in camera-equipped electronic apparatuses, such as, for example, cellular phones and/or the like, a CMOS sensor or a CCD sensor is used as an image pickup device.

FIG. 4 is a cross sectional view showing a prior art camera module 11. The camera module 11 is composed of a lens unit 12 and an image pickup device portion 13 provided under the lens unit 12.

The lens unit 12 includes a barrel 121 in which an objective lens 123 and a lens 124 are provided and a lens holder 122 in which the barrel 121 is rotatably held. The barrel 121 is moved in a direction of an optical axis when turning the barrel 121 with respect to the lens holder 122, whereby focus adjustment is carried out.

The image pickup device portion 13 includes a base 131 in which an opening 134 having a substantially square shape is formed at the top surface thereof, an IR cut filter 14 provided so as to cover the opening 134, a substrate 16 provided under the base 131 and an image pickup device 15 mounted on the top surface of the substrate 16. In this camera module 11, a CMOS sensor is used as the image pickup device 15.

In the camera module 11, a light path 17 is formed from a barrel opening 126, which will be described later, of the barrel 121 to the image pickup device 15 through the objective lens 123, the lens 124 and the IR cut filter 14. The light path 17 is defined or surrounded by inner peripheral surfaces of the components, such as, for example, the inner peripheral surface of the barrel 121 and the inner peripheral surface of the opening 134 of the base 131 and/or the like. On these inner peripheral surfaces, various step portions are formed so as to protrude toward the light path 17. For example, the barrel opening 126 of the barrel 121 has an outside opening portion 135 having a conically inclined inner peripheral surface, and a lot of step portions, such as, for example, steps 128a to 128e which are formed on the conical inclined inner peripheral surface of the outside opening portion 135 in a stair-like manner. Further, on the inner peripheral surface of the barrel opening 126 of the barrel 121, an annular edge 127 is also formed so as to protrude toward the light path 17. Furthermore, the edges of the base 131 defining the opening 134 also protrude toward the light path 17 to form one of the step portions mentioned above.

Hereinbelow, among these step portions which are formed so as to protrude toward the light path 17, the step portions formed on the inner peripheral surface of the barrel 12 will be described in more detail.

The barrel opening 126 is formed at a center of the upper portion of the barrel 121. The annular edge 127 is one of the step portions formed on the inner peripheral surfaces defining the light path 17. The annular edge 127 serves as a diaphragm for controlling an amount of light and reducing chromatic aberration. The annular edge 127 has a lower annular corner portion (lens side portion) 125 which is formed to have a right angle in its cross section.

The barrel opening 126 also has the outside opening portion 135 which is formed into a shallow conical shape having an inclined inner peripheral surface diverging from the annular edge 127 inwardly with respect to the outside. The outside opening portion 135 also forms one of the inner peripheral surfaces defining the light path 17. On the conically inclined inner peripheral surface of the outside opening portion 128, the steps 128a to 128e are formed in a stair-like manner as described above. These steps 128a to 128e are formed for preventing stray light from being generated at the outside opening portion 128.

The inner surface of the barrel opening 126, namely, the surfaces of the annular edge 127 and the outside opening portion 135 are subjected to staining processing (hereinbelow, simply referred to as "staining" on occasion) for preventing generation of stray light which would be caused by reflection of external light on these surfaces since such stray light becomes cause of generation of ghost image, flare and the like.

However, since the camera module 11 is to be equipped in a cellular phone and the like, it necessarily has a particularly compact size, for example, 6 mm in length, 6 mm in width and 4.5 mm in height. Accordingly, the barrel 121 also has an extremely small size, and thus an extremely small size mold is used for producing the barrel 121. The mold has an annular step portion for forming the lower annular corner portion 125 of the annular edge 127. However, the size of the annular step portion of the mold is extremely small. Therefore, it is very difficult to form very minute irregularities for the staining processing on the annular step portion of the mold appropriately. Namely, since the annular step portion of the mold for forming the lower annular corner portion 125 of the annular edge 127 has a right-angled shape in its cross section, it is very difficult to form minute irregularities for staining on such a right-angled shape portion of the mold surely. This means that minute irregularities by staining cannot be formed on the lower annular corner portion 125 sufficiently, which results in the case that undesirable stray light is generated at the lower annular corner portion 125 whereby generating ghost image, flare and the like.

SUMMARY OF THE INVENTION

In view of the problem described above, it is an object of the present invention to provide a camera module in which predetermined minute irregularities by staining are sufficiently formed on an inner peripheral surface defining a light path of the camera module even in the case where the camera module has a relatively compact size.

In order to achieve the above object, the present invention is directed to a camera module which has: a lens unit including at least one lens, a barrel provided with the at least one lens and having a barrel opening, and a lens holder for holding the barrel; and an image pickup device portion provided under the lens unit and having an image pickup device housing space in which an image pickup device is hermetically provided. The barrel opening of the barrel has an annular edge which serves as a diaphragm, and the annular edge of the barrel opening has a lower annular corner portion which is located on the side of the lens. The lower annular corner portion of the annular edge is formed so as to have a rounded cross-sectional shape and staining is formed on the surface of the lower annular corner portion.

According to the camera module having the above structure, minute irregularities with staining are sufficiently and surely formed on the surface of the lower annular corner portion of the annular edge of the barrel opening of the barrel. It is possible to prevent undesirable stray light from being generated at the lower annular corner portion, thereby enabling to prevent ghost image, flare and the like from being generated. Further, a mold for forming the barrel having such a lower annular corner portion of the annular edge of the barrel opening does not need to have an accurate annular step portion having a right-angled cross section. Namely, the annular step portion of the mold for forming the lower annular corner portion can be formed so as to have a smooth curved surface. Therefore, minute irregularities for staining processing can be formed easily on the annular step portion of the mold. Furthermore, since the annular step portion of the mold for forming the lower annular corner portion has such a smooth curved surface, sandblast can be used for forming such minute irregularities for staining on the annular step portion of the mold.

In the camera module according to the present invention, it is preferred that the barrel opening of the barrel has an outside opening portion which is formed into a conical shape having an inclined surface diverging from the annular edge thereof toward the outside of the barrel, and at least one annular step portion is formed on the inclined surface of the outside opening portion of the barrel opening, wherein the step portion is formed so as to have a rounded cross-sectional shape and staining is formed thereon.

According to the camera module having the above structure, sufficient minute irregularities with staining are formed on the step portion of the inclined surface of the barrel opening of the barrel in addition to the lower annular corner portion of the annular edge of the barrel opening. Therefore, the above effects of preventing generation of undesirable stray light is further enhanced. In particular, it is possible to prevent generation of undesirable stray light caused by external light entering into the barrel opening from various directions. Further, a mold for forming the barrel having such step portion can also be manufactured with relative easy.

Further, in the camera module according to the present invention, it is also preferred that the camera module has a light path which extends from the lens unit to the image pickup device portion, the light path being defined or surrounded by inner peripheral surfaces of the barrel and the image pickup device portion, wherein at least one step portion is formed on the inner peripheral surfaces so as to protrude toward the light path, and the step portion is formed so as to have a rounded cross-sectional shape and staining is formed thereon.

According to the camera module having the above structure, sufficient minute irregularities with staining are formed on the step portion of the inner peripheral surfaces defining the light path in addition to the lower annular corner portion of the annular edge of the barrel opening. Therefore, the above effects of preventing generation of undesirable stray light is further enhanced. In particular, it is possible to prevent generation of undesirable stray light in the light path of the camera module. Further, a mold for forming the component of the camera module having such step portion can also be manufactured with relative easy.

Further, in the camera module according to the present invention, it is also preferred that the rounded cross-sectional shape is a roughly arc-shape of about 90 degrees.

According to the camera module having the above structure, a mold for forming the barrel can be manufactured with relative easy, and use of such a mold make it possible to produce a large number of barrels having the same shape stability.

The foregoing and other objects, features and advantages of the present invention will become more readily apparent from the following detailed description of preferred embodiments of the invention which proceeds with reference to the accompanying drawings.

DETAILED DESCRIPTION OF THE INVENTION

Hereinbelow, a camera module 1 according to the first embodiment of the present invention will be described in detail with reference to the appended drawings. In this regard, it is to be noted that since the camera module 1 is to be equipped in small electronic apparatuses, such as, for example, cellar phones, it has a particularly compact size, for example, 6 mm in length, 6 mm in width and 4.5 mm in height.

Figure 1:
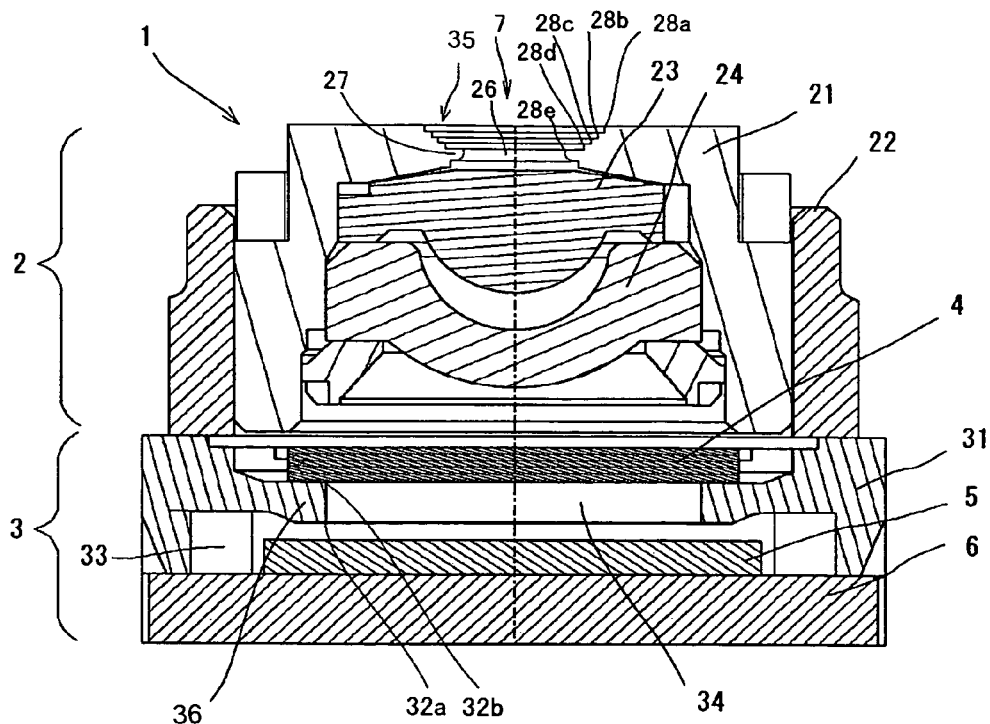
FIG. 1 is a cross sectional view of a camera module 1 according to the first embodiment of the present invention.

FIG. 1 illustrates a cross sectional view of the camera module 1 according to a first embodiment of the present invention. The camera module 1 is composed of a lens unit 2 having an objective lens 23 and a lens 24, and an image pickup device portion 3 provided under the lens unit 2 and having an image pickup device housing space 33 in which an image pickup device (that is, a CMOS sensor) 5 is hermetically provided.

In more details, the lens unit 2 has the objective lens 23, the lens 24 and a barrel 21 provided with the objective lens 23 and the lens 24. The barrel 21 has a barrel opening 26, and a lens holder 22 in which the barrel 21 is rotatably held. An annular edge 27 which serves as a diaphragm is formed in the barrel opening 26, and a lower annular corner portion (lens side portion) 25 of the annular edge 27 which is located on the side of the lenses. The annular corner portion is formed to have a rounded cross-sectional shape on which minute irregularities with staining are formed. The barrel 21 is moved in an optical axis direction when turning the barrel 21 with respect to the lens holder 22, whereby focus adjustment is carried out. In this regard, it is to be noted that the lens unit 2 having the objective lens 23 and the lens 24 is an example of an optical system used in a camera module, and the lens unit 2 may be of the type equipped with another optical system.

The image pickup device portion 3 has a substrate 6 on which an image pickup device (CMOS sensor) 5 is mounted, a base 31 provided on the substrate 6. Further, the image pickup device portion 3 has an opening 34 for introducing light entering through the objective lens 23 and the lens 24 into the image pickup device 5 on the top surface thereof. Moreover, the image pickup device portion 3 has an IR cut filter 4 provided so as to cover the opening 34 of the base 31. An image pickup device housing space 33 is a sealed space defined by the substrate 6, the base 31 and the IR cut filter 4.

In the camera module 1, a light path 7 is formed from the barrel opening 26 of the barrel 21 to the image pickup device 5 through the objective lens 23, lens 24 and the IR cut filter 4.

On inner peripheral surfaces of the barrel 21 defining or surrounding the light path 7, the annular edge 27 of the barrel opening 26 is formed as a step portion so as to protrude toward the light path 7, that is, toward the inside the light path 7.

The barrel opening 26 is formed at a center of the upper portion of the barrel 21, and the annular edge 27 of the barrel opening 26 serves as a diaphragm for controlling amount of light and reducing chromatic aberration and the like. Due to its function as a diaphragm, undesirable diffraction and stray light caused by the undesirable diffraction are likely to occur at this portion.

Figure 2:
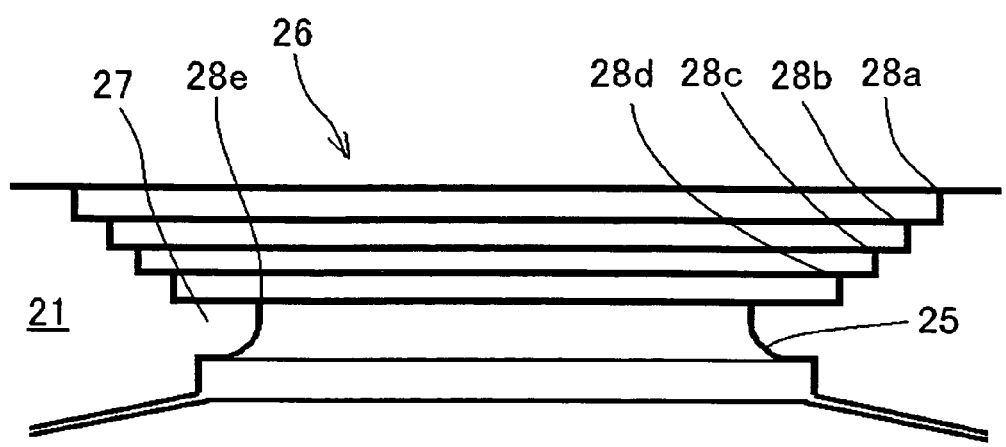
FIG. 2 is an enlarged cross sectional view of a barrel opening 26 of the camera module 1 as shown in FIG. 1.

As shown in FIG. 2, the lower annular corner portion 25 of the annular edge 27 of the barrel opening 26 is formed so as to have a rounded cross-sectional shape (chamfered so as to have a roughly C-shaped cross section) and minute irregularities with staining are formed on the surface thereof. Since the lower annular corner portion 25 of the annular edge 27 of the barrel opening 26 has a rounded cross-sectional shape which forms a roughly arc-shape of about 90 degree, a portion of the mold (that is, an annular step portion of the mold) for forming the lower annular corner portion 25 is also formed to have a corresponding rounded cross-sectional shape, whereby making it possible to form minute irregularities for staining easily on this annular step portion of the mold. In addition, such a mold for forming the barrel can be manufactured with relative easy, and use of such a mold makes it possible to produce a large number of barrels having the same shape stability.

Further, an outside opening portion 35 is formed in the barrel opening 26 so as to have a shallow conical shape having an inclined surface diverging from the annular edge 27 thereof inwardly with respect to the outside of the barrel 21 (that is, toward the upper side in FIG. 1). On the conically inclined surface of the outside opening portion 28, steps (step portions) 28a to 28e are formed in a stair-like manner.

Hereinafter, function and effect of the camera module 1 according to the first embodiment of the present invention having the lower annular corner portion 25 of the annular edge 27 described above will be described.

In the camera module 1, the lower annular corner portion 25 of the annular edge 27 is formed so as to have a rounded cross-sectional shape which forms an arc of about 90 degrees. Therefore, in the mold for forming such a barrel 21, a part of the mold (an annular step portion of the mold) corresponding to the lower annular corner portion 25 is also formed so as to have a corresponding rounded cross-sectional shape which forms an arc of about 90 degrees. Namely, the part of the mold corresponding to the lower annular corner portion 25 is formed to have a continuous smooth rounded cross-sectional shape instead of a right-angled cross-sectional shape. That is, the annular step portion of the mold has a smooth curved surface.

On the smooth curved surface of the mold for forming the barrel 21, minute irregularities from staining are formed. Such minute irregularities are formed by corroding the surface of the mold with chemicals and the like. In the mold for forming the barrel 21, since the annular step portion of the mold has a continuous smooth curved surface, it is possible to form predetermined minute irregularities for staining on the surface of the mold easily. In addition, it is also possible to form such minute irregularities for staining by sandblasting without using the above-mentioned corroding method with chemicals. It is possible to form minute irregularities with staining on the lower annular corner portion 25 of the annular edge 27 easily even in the case where the barrel 21 has a particularly compact size for use in the camera module 1.

Figure 3:
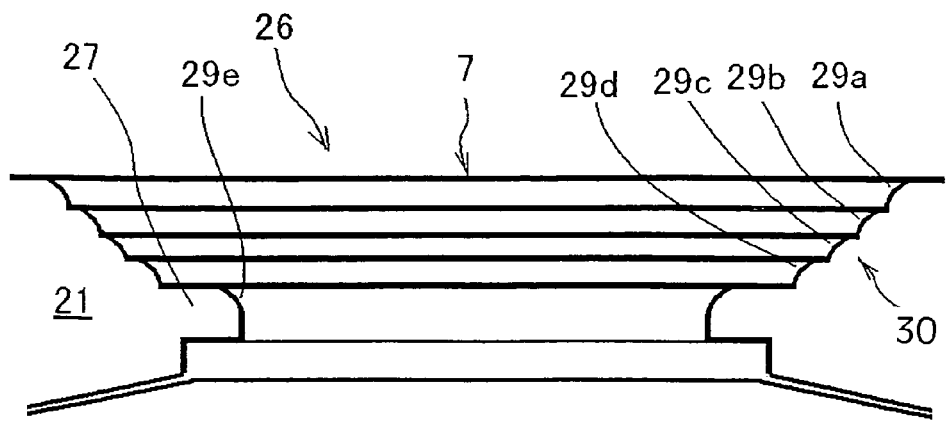
FIG. 3 is an enlarged cross sectional view of a barrel opening 26 in another embodiment of the present invention.
Figure 4:
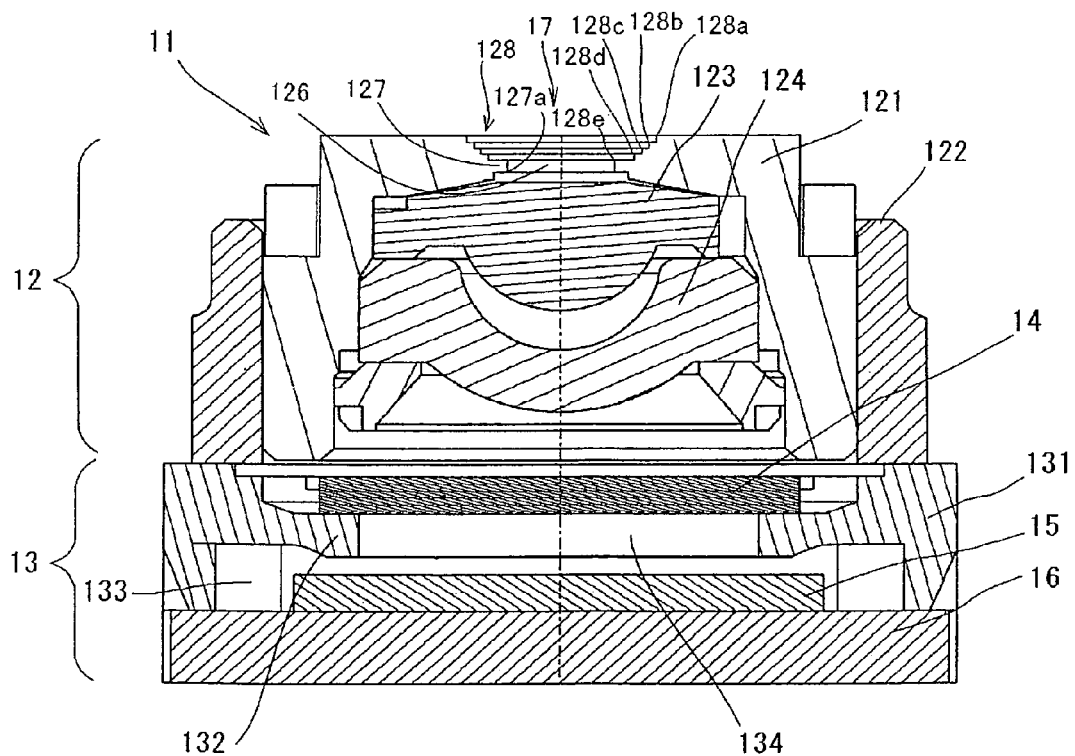
FIG. 4 is a cross sectional view of a prior art camera module.

Next, a camera module according to a second embodiment of the present invention will be described as illustrated in FIG. 3. The camera module of the second embodiment has the same structure as that of the camera module 1 of the first embodiment except for the outside opening portion 35 of the barrel opening 26. In the following description, the same reference numbers are used in both the camera module 1 of the first embodiment and the camera module of the second embodiment for the members or components having the same structure.

In a barrel opening 26 of a camera module of the second embodiment, an outside opening portion 30 is formed to provide a shallow conical shape having an inclined surface diverging from an edge 27 inward with respect to the outside of the barrel 21. On the conically inclined surface of the barrel opening 26, steps (step portions) 29a-29e are formed in a stair-like manner. These steps 29a-29e in the step positions are provided on the inner peripheral surfaces defining or surrounding the light path 7 so as to protrude toward the light path 7.

Each of the steps 29a-29e is formed to have a rounded cross-sectional shape which forms a roughly arc-shape of about 90 degrees and minute irregularities with staining are also formed on the surface of each of the steps 29a-29e. In this regard, it is to be noted that the outside opening 30 formed with these steps is also a portion of the camera module where undesirable stray light is likely to be generated, because external light entering into the barrel 21 from various direction is reflected on the steps 29a-29e at the light incoming side of the lens unit 2.

Next, function and effect of the steps 29a-29e of the outside opening portion 30 of the camera module according to the second embodiment of the present invention will be described.

In the camera module of the second embodiment, each of the steps 29a-29e of the outside opening portion 30 is formed so as to have a rounded cross-sectional shape which forms a roughly arc-shape of about 90 degrees as described above. In the mold for forming the barrel 21 having the steps 29a-29e, a portion of the mold (an annular step portion of the mold) corresponding to each of the steps 29a-29e is also formed to have a corresponding rounded cross-sectional shape. Namely, the annular step portion of the mold corresponding to each of the steps 29a-29e has a continuous smooth rounded cross-sectional shape instead of a right-angled cross-sectional shape. That is, the annular step portion of the mold can have a smooth curved surface. By using such a mold, minute irregularities with staining can be formed on the surfaces of the steps 29a-29e of the outside opening portion 30 sufficiently, thus making it possible to effectively prevent generation of undesirable stray light caused by external light entering into the barrel 21 from various directions. In addition, it is possible to form minute irregularities for staining on the annular step portion of the mold easily by corroding with chemicals and/or with sandblasting.

The rounded cross-sectional shape described in the first embodiment and the second embodiment can be applied to all step portions which are formed on the inner peripheral surfaces of the components for defining or for surrounding the light path 7 of the camera module 1 so as to protrude toward the light path 7. For example, each of edges 32a, 32b of an overhang portion 3 of the base 31 of the camera module 1 as shown in FIG. 1 which defines the opening 34 can also have a rounded cross-sectional shape with minute irregularities with staining. Namely, in such a camera module 1, the light path 7 is formed from the lens unit 2 to the image pickup device portion 3, and a step portion is formed on inner peripheral surfaces for defining or for surrounding the light path 7 so as to protrude toward the light path 7. According to the present invention, such a step portion can be formed so as to have a rounded cross-sectional shape on which minute irregularities with staining are formed.

Finally, it should be understood that the present invention is not limited to the preferred embodiments described hereinabove and, needless to say, a variety of modifications or variations may be made without departing from the scope of the invention defined in the following claims.

Further, it is also to be understood that the present disclosure relates to subject matter contained in Japanese Patent Application No. 2005-258498 (filed on Sep. 6, 2005) which is expressly incorporated herein by reference in its entirety.

We claim:

1. A camera module comprising:
    a lens unit including at least one lens, a barrel provided with the at least one lens and having a barrel opening, and a lens holder for holding the barrel; and
    an image pickup device portion provided under the lens unit and having an image pickup device housing space in which an image pickup device is hermetically provided; wherein the barrel opening of the barrel has an annular edge which serves as a diaphragm, and the annular edge of the barrel opening has a lower annular corner portion which is located on the side of the lens, wherein the lower annular corner portion of the annular edge is formed so as to have a rounded cross-sectional shape and satining is formed on the lower annular corner portion.

2. The camera module of claim 1 wherein the barrel opening of the barrel has an outside opening portion which is formed into a conical shape having an inclined surface diverging from the annular edge thereof toward the outside of the barrel, and at least one annular step portion is formed on the inclined surface of the outside opening portion of the barrel opening, wherein the step portion is formed so as to have a rounded cross-sectional shape and satining is formed thereon.

3. The camera module of claim 1 wherein the camera module has a light path which extends from the lens unit to the image pickup device portion, the light path being defined or surrounded by inner peripheral surfaces of the barrel and the image pickup device portion, wherein at least one step portion is formed on the inner peripheral surfaces so as to protrude toward the light path, and the step portion is formed so as to have a rounded cross-sectional shape and satining is formed thereon.

4. The camera module of claim 1 wherein the rounded cross-sectional shape is a roughly arc-shape of about 90 degree.

* * * * *

UNITED STATES PATENT AND TRADEMARK OFFICE
CERTIFICATE OF CORRECTION

PATENT NO.         : 7,530,748 B2
APPLICATION NO.    : 11/495474
DATED              : May 12, 2009
INVENTOR(S)        : Shibata et al.

It is certified that error appears in the above-identified patent and that said Letters Patent is hereby corrected as shown below:

In the Abstract, change "staining" to "satining"
In column 1, line 13, change "a cellular phones" to "cellular phones"
In column 2, line 17, change "staining" to "satining"
In column 2, line 18, change "staining" to "satining"
In column 2, line 21, change "ghost image" to "ghost images"
In column 2, line 33, change "staining" to "satining"
In column 2, line 37, change "staining" to "satining"
In column 2, line 39, change "staining" to "satining"
In column 2, line 42, change "ghost image" to "ghost images"
In column 2, line 50, change "staining" to "satining"
In column 2, line 66, change "staining" to "satining"
In column 3, line 2, change "staining" to "satining"
In column 3, line 7, change "ghost image" to "ghost images"
In column 3, line 14, change "staining" to "satining"
In column 3, line 19, change "staining" to "satining"
In column 3, line 29, change "staining" to "satining"
In column 3, line 31, change "staining" to "satining"
In column 3, line 40, change "with relative easy" to "with relative ease"
In column 3, line 49, change "staining" to "satining"
In column 3, line 52, change "staining" to "satining"
In column 3, line 61, change "with relative easy" to "with relative ease"
In column 4, line 1, change "with relative easy" to "with relative ease"
In column 4, line 1, change "a mold make" to "a mold makes"
In column 4, line 7, change "controlling amount" to "controlling an amount"
In column 4, line 27, change "cellar phones" to "cellular phones"
In column 4, line 48, change "staining" to "satining"
In column 5, line 16, change "staining" to "satining"
In column 5, line 19, change "90 degree" to "90 degrees"
In column 5, line 24, change "staining" to "satining"
In column 5, line 26, change "with relative easy" to "with relative ease"
In column 5, line 55, change "staining" to "satining"
In column 5, line 60, change "staining" to "satining"
In column 5, line 62, change "staining" to "satining"
In column 5, line 65, change "staining" to "satining"
In column 6, line 23, change "staining" to "satining"
In column 6, line 48, change "staining" to "satining"

UNITED STATES PATENT AND TRADEMARK OFFICE
CERTIFICATE OF CORRECTION

PATENT NO. : 7,530,748 B2
APPLICATION NO. : 11/495474
DATED : May 12, 2009
INVENTOR(S) : Shibata et al.

It is certified that error appears in the above-identified patent and that said Letters Patent is hereby corrected as shown below:

In column 6, line 53, change "staining" to "satining"
In column 6, line 65, change "staining" to "satining"
In column 7, line 5, change "staining" to "satining"
In column 8, line 24, change "90 degree" to "90 degrees"

Signed and Sealed this

Eighth Day of September, 2009

David J. Kappos
*Director of the United States Patent and Trademark Office*